US007696798B2

(12) United States Patent
Pendurkar (10) Patent No.: US 7,696,798 B2
(45) Date of Patent: Apr. 13, 2010

(54) METHOD AND APPARATUS TO GENERATE SYSTEM CLOCK SYNCHRONIZATION PULSES USING A PLL LOCK DETECT SIGNAL (75) Inventor: Rajesh Pendurkar, Los Gatos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/028,656

(22) Filed: Feb. 8, 2008

(65) Prior Publication Data
US 2009/0201057 A1   Aug. 13, 2009

(51) Int. Cl.
H03L 7/06   (2006.01)

(52) U.S. Cl. ............... 327/156; 327/147; 327/149; 327/158

(58) Field of Classification Search ................. 327/147, 327/149, 156, 158
See application file for complete search history.

(56) References Cited

U.S. PATENT DOCUMENTS

| 6,320,469 | B1* | 11/2001 | Friedberg et al. | 331/1 A |
| 6,515,526 | B2* | 2/2003 | Dairi | 327/156 |
| 6,844,943 | B2* | 1/2005 | McKee et al. | 358/471 |
| 6,909,762 | B2* | 6/2005 | Cao et al. | 375/376 |
| 7,084,681 | B2* | 8/2006 | Green et al. | 327/147 |
| 7,103,130 | B2* | 9/2006 | Cao et al. | 375/374 |
| 7,268,629 | B2* | 9/2007 | Takase | 331/1 A |
| 7,301,379 | B1* | 11/2007 | Burlingame et al. | 327/158 |
| 7,319,350 | B2* | 1/2008 | Kakuta | 327/156 |
| 7,366,269 | B2* | 4/2008 | Ishida et al. | 375/368 |
| 7,495,517 | B1* | 2/2009 | Hoang et al. | 331/16 |
| 7,508,281 | B2* | 3/2009 | Kobata | 331/182 |
| 7,511,543 | B2* | 3/2009 | Friedman et al. | 327/156 |
| 7,519,140 | B2* | 4/2009 | Yoshimura | 375/376 |
| 7,595,672 | B2* | 9/2009 | Chen | 327/158 |
| 2004/0232951 | A1* | 11/2004 | Tan et al. | 327/105 |
| 2005/0226357 | A1* | 10/2005 | Yoshimura | 375/376 |
| 2006/0192593 | A1* | 8/2006 | Dai | 327/43 |
| 2006/0280276 | A1* | 12/2006 | Chen et al. | 375/376 |
| 2007/0071155 | A1* | 3/2007 | Boerstler et al. | 375/376 |

(Continued)

FOREIGN PATENT DOCUMENTS

JP   H07-201137   *   4/1995

(Continued)

*Primary Examiner*—Lincoln Donovan
*Assistant Examiner*—Adam D Houston
(74) *Attorney, Agent, or Firm*—Martine Penilla & Gencarella, LLP (57) ABSTRACT Method and apparatus for generating system clock synchronization pulses using a Phase Locked Loop (PLL) lock detect signal are provided. The method includes utilizing a clock lock detect signal indicative that a system clock is synchronized with an internal clock, and determining an initial count value. Then, start counting beginning at a first rising edge of the system clock after the clock lock detect signal is generated, the counting starting with the initial count value. The method further includes generating a synchronization pulse (syncnp) when the counting ends, where the syncnp indicates the beginning of the next system clock cycle, and continue generating syncnps separated by one system clock cycle so as to continue indicating the beginning of the next system clock cycle. The method further guarantees stopping the syncnp generation when the lock detect is inactive indicating that the internal clock and the system clock are not synchronized.

12 Claims, 7 Drawing Sheets

U.S. PATENT DOCUMENTS

2008/0143814 A1* 6/2008 Masui et al. .................. 347/249
2009/0079479 A1* 3/2009 Chen ........................... 327/156
2009/0096906 A1* 4/2009 Senda et al. ................. 348/312
2009/0168944 A1* 7/2009 Song et al. .................. 375/376
2009/0251226 A1* 10/2009 Kathuria et al. ............. 331/1 R

FOREIGN PATENT DOCUMENTS

JP          07201137 A  *  8/1995

* cited by examiner

METHOD AND APPARATUS TO GENERATE SYSTEM CLOCK SYNCHRONIZATION PULSES USING A PLL LOCK DETECT SIGNAL

BACKGROUND

1. Field of the Invention

The present invention relates to synchronizing events between electronic components in a computer system sharing a system clock, where the electronic components use internal clock frequencies different from the system clock frequency.

2. Description of the Related Art

Synchronization is a critical part of modern computer systems, as different components use different clock speeds and different sources for timing information. For example, a circuit board is often driven by a system clock and the different components on the board use higher speeds by using internal clock speeds faster than the system clock speed. In order for the different components on the board to work together, it is required that the inputs and outputs be synchronized. This synchronization is usually performed by using the system clock as reference, where the internal clock of a board component uses a frequency that is a multiple of the system clock frequency, and where the system clock rising edge coincides with the rising edge of one of the cycles of the internal clock.

Knowing when the system and the internal clocks are synchronized is therefore critical. Additionally, it is often important for the logic running inside a board component to know exactly when the system clock rising edge is appearing so the signals in the input and output lines are asserted at the right time. For example, automatic test equipment (ATE) uses the system clock to drive the tester pins, and the data has to be setup and strobed with respect to the edge of the system clock. In the case of microprocessors, their internal clocks usually run at a much higher frequencies than the one from the system clock by using internal PLL clocks that derive the internal frequencies by multiplying the system clock frequency with one of the multipliers supported in the PLL design.

Thus, the internal logic and circuitry of an electronic component must identify reliably when the system clock and the internal clock are synchronized in order to perform reliable interaction with other electronic components.

It is in this context that embodiments of the invention arise.

SUMMARY

Electronic components need to know accurately when certain edges of the system clock signal appear on the pins of a chip. In one embodiment, a synchronization pulse generation circuitry generates internal clock wide pulses ahead of the system clock cycle to indicate the upcoming rising edge of the system clock signal. These signals are named 'clksync' or 'syncp' signals. However, these clksync signals are irrelevant if the system and the internal clocks are not synchronized, or in other words, the internal clock is not locked to the system clock. Therefore, the reliable generation of the clksync pulses is important and required.

Embodiments of the present invention provide methods and systems for generating clock synchronization pulses, indicative of an upcoming system clock cycle, using a Phase Locked Loop (PLL) lock detect signal. The PLL lock detect signal is generated when the internally generated clock by the Voltage Controlled Oscillator (VCO) is phase-aligned, also called locked, with the external system clock used as reference. By relying on this PLL lock detect signal, the system stops producing clksync pulses while the clocks are not synchronized (not locked), thereby avoiding synchronization problems when the clocks are out of sync. This method guarantees the validity of the clksync pulses even when the ratio between the internal and system clock frequencies is changing.

It should be appreciated that the present invention can be implemented in numerous ways, such as a process, an apparatus, a system, a device or a method on a computer readable medium. Several inventive embodiments of the present invention are described below.

In one embodiment, a method for generating system clock synchronization pulses (syncnp) is provided. The method includes generating a clock lock detect signal indicative that a system clock is synchronized with an internal clock, and determining an initial count value. Then, start counting beginning at a first rising edge of the system clock after the clock lock detect signal is generated, the counting starting with the initial count value. The method further includes generating a syncnp when the counting ends, where the syncnp indicates the beginning of the next system clock cycle, and continue generating syncnps separated by one system clock cycle so as to continue indicating the beginning of the next system clock cycle.

In another embodiment, a system for generating system clock synchronization pulses (syncnp) is provided. The system comprises a system clock, an internal clock, circuitry to generate a clock lock detect signal when the system clock is synchronized with the internal clock, and a programmable counter. The system further comprises a cycle load multiplexer whose select signal is logic high when the programmable counter reaches zero, and the input in the cycle load multiplexer that corresponds to a logic high select signal is the ratio between the frequencies of the internal clock and the system clock minus one, which is basically a down count. The other input to the cycle load multiplexer is the value of the programmable counter minus one. The system also includes a first count load multiplexer whose select signal is set to logic high during a first rising edge of the system clock after the clock lock detect signal is generated. The input in the first count load multiplexer that corresponds to a logic select high is a syncnp selector value, and the other input to the first count load multiplexer is the output of the cycle load multiplexer. The output of the first count load multiplexer is used to set the initial count value in the programmable counter. In this system, the programmable counter produces the syncnp when the counter reaches zero, and the syncnp is indicative of the beginning of an upcoming rising edge of the system clock signal. The syncnp generation is disabled when the clock lock detect signal indicates that the system clock is not synchronized with the internal clock.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

Method and apparatus for generating system clock synchronization pulses using a Phase Locked Loop (PLL) lock detect signal are provided. The method includes generating a clock lock detect, or pll_lock_detect, signal indicative that a system clock is synchronized with an internal clock, and determining an initial count value. Then, start counting beginning at a first rising edge of the system clock after the clock lock detect signal is generated, the counting starting with the initial count value. The method further includes generating a synchronization pulse (syncnp) when the counting ends, where the syncnp indicates the beginning of the next system clock cycle after n internal clock cycles, and continue generating syncnps separated by one system clock cycle so as to continue indicating the beginning of the next system clock cycle.

These syncnp signals are always in the same relative internal clock cycle relative to the system clock rising edge. The second 'n' in 'syncnp' refers to the number of internal clock cycles before the beginning of the system clock cycle where the syncnp pulse is desired. For example, a sync1p pulse would occur in the internal clock cycle right before the beginning of the system clock cycle, a sync2p pulse would occur in the internal clock cycle previous to sync1p, or in other words two internal clock cycles before the rising edge of the system clock, etc. Whenever the clock ratio changes, a pll lock detect signal is used to correctly generate the syncp signals once the internal clock 'locks' to the system clock. A programmable down counter, which is enabled by the pll lock detect signal and the system clock edge detector, is used to generate the syncnp signals. The programmable down counter is loaded with an initial value based on the clock frequencies ratio. The person skilled in the art will appreciate that a similar solution can be accomplished by using a programmable up counter.

The use of the pll lock detect signal simplifies the complex circuitry needed to identify the clock adjustment needed as the clock ratio changes. Other solutions may wait a number of cycles before attempting I/O operations, with a number of cycles high enough to make sure that the clocks are synchronized even for the worst case scenario. This solution wastes unnecessary cycles, even after the internal clock locks to the system clock.

The following embodiments of the present invention provide methods and systems for generating clock synchronization pulses, indicative of an upcoming system clock cycle, by using a Phase Locked Loop (PLL) lock detect signal. The PLL lock detect signal is generated when the system and internal clocks are synchronized, and by relying on this PLL lock detect signal, the system stops producing clksync pulses while the clocks are not synchronized, thereby avoiding synchronization problems when the clocks are out of sync. This method guarantees the validity of the clksync pulses even when the ratio between the internal and system clock frequencies is changing.

It will be obvious, however, to one skilled in the art, that the present invention may be practiced without some or all of these specific details. In other instances, well known process operations have not been described in detail in order not to unnecessarily obscure the present invention.

Figure 1:
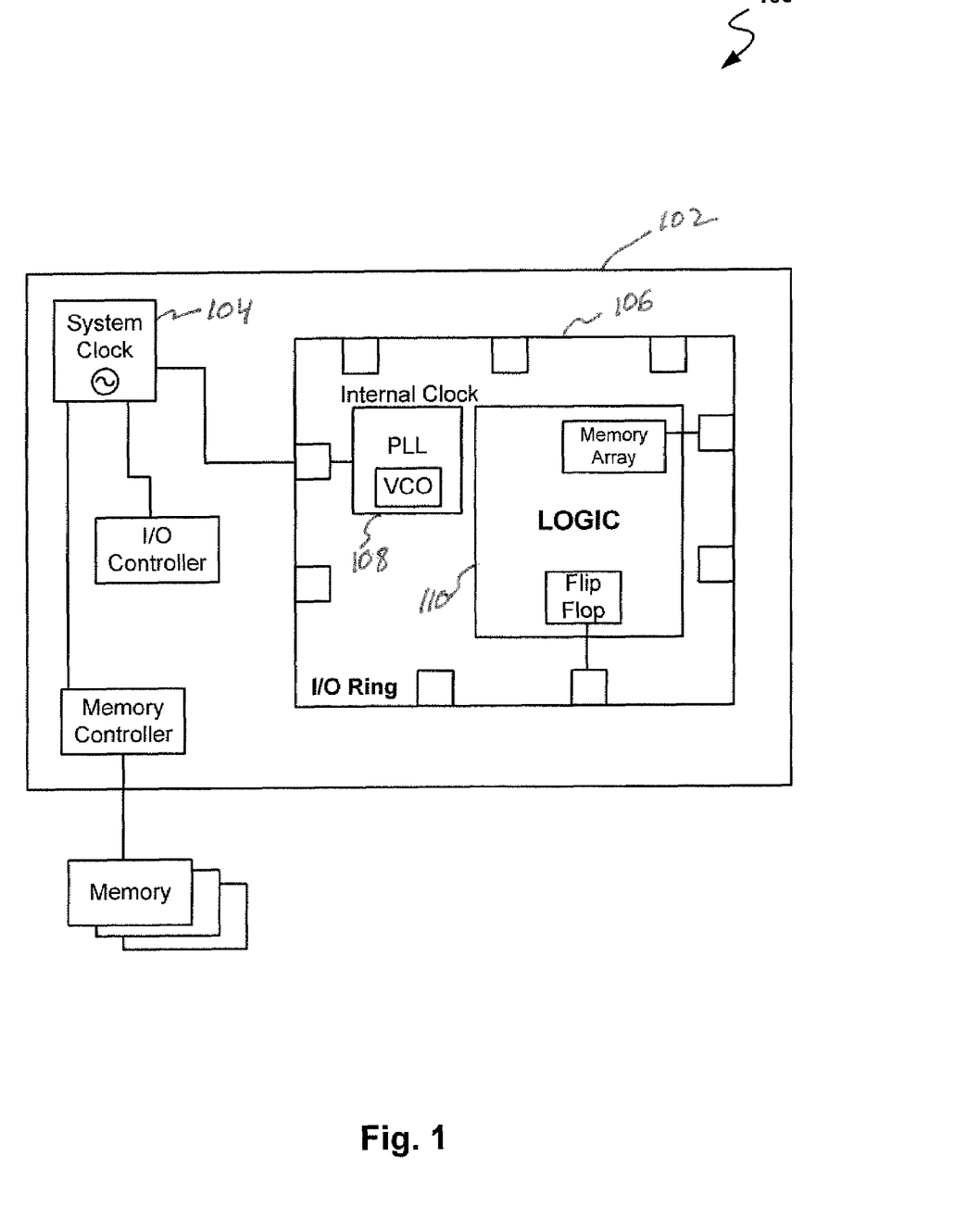
FIG. 1 depicts a schematic diagram of a system including a system clock and an internal clock inside a programmable device.

FIG. 1 depicts a schematic diagram of system 102 including system clock 104, and internal clock 108 inside programmable device 106. In one embodiment, system 102 is a computer board that holds a plurality of devices. The board is driven by system clock 104 whose signal is propagated to the different devices on the board, such as programmable device 106, an Input/Output (I/O) controller, a memory controller, etc. Programmable device 106 includes an I/O ring, a PLL that generates the internal timing for programmable device 106, and internal logic 110. The I/O ring must operate at the speed of the board, therefore the I/O ring must slow down the communications from the inside logic if running at a higher internal speed.

Internal syncnp pulses are generated inside programmable device 106 to indicate when internal clock 108 is locked to system clock 104 in order to guarantee that I/O operations have the right timing when programmable device 106 interacts with other elements in system 102. In one implementation, the system clock runs at 333 MHz while other devices like the I/O controller and the microprocessor run at 1.2 GHz. This means a ratio of 4 between the internal clock and the system clock frequencies.

Figure 2:
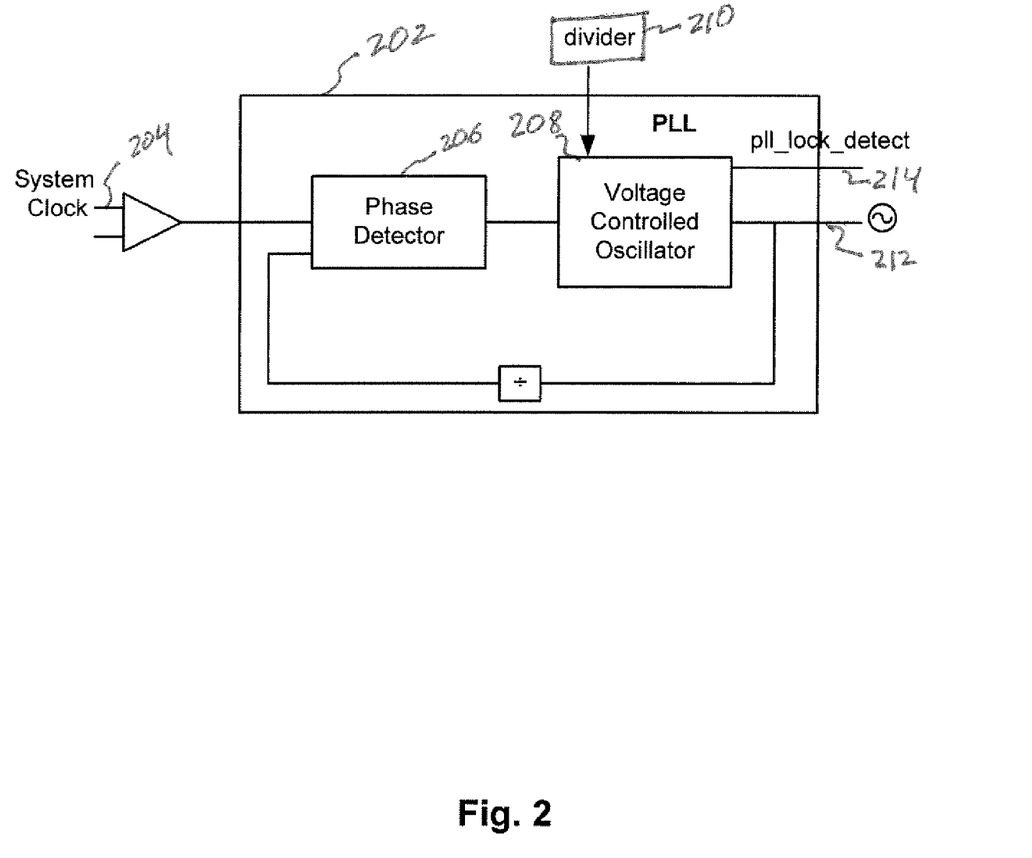
FIG. 2 shows the derivation of an internal clock and a PLL lock detect signal with respect to an external system clock in one embodiment of the invention.

FIG. 2 shows the derivation of internal clock 212 and PLL lock detect signal 214 with respect to external system clock 204 in one embodiment of the invention. A simplified diagram of PLL 202 includes a phase detector 206 and a voltage control oscillator (VCO) 208. Phase detector 206 is a frequency mixer or analog multiplier circuit that generates a voltage signal which represents the difference in phase between two signal inputs. VCO 208 is an electronic oscillator designed to be controlled in oscillation frequency by divider input 210 and in oscillation phase by phase detector 206, thereby determining the internal clock signal 212 generated by PLL 202. For example, a divider value of 8, will make internal clock signal 212 be 8 times the frequency of system clock 204. In one embodiment, VCO 208 also generates pll_lock_detect 214 signal indicative that the system clock is in sync with the generated internal clock signal 212. Being in sync means that the rising edge of the pulse generated by system clock 204 coincides with the rising edge of an internal clock pulse. In another embodiment, the pll_lock_detect signal can be generated outside the PLL by comparing system clock signal 204 and internal clock signal 212.

The pll_lock_detect 214 signal goes logic low whenever the PLL receives different clock ratio bits from divider 210 indicating a change in internal clock signal frequency 212, and remains low until the PLL locks to the new ratio. When the PLL locks to the new effective clock ratio, pll_lock_detect 214 signal goes logic high triggering the syncp generation.

Figure 3:
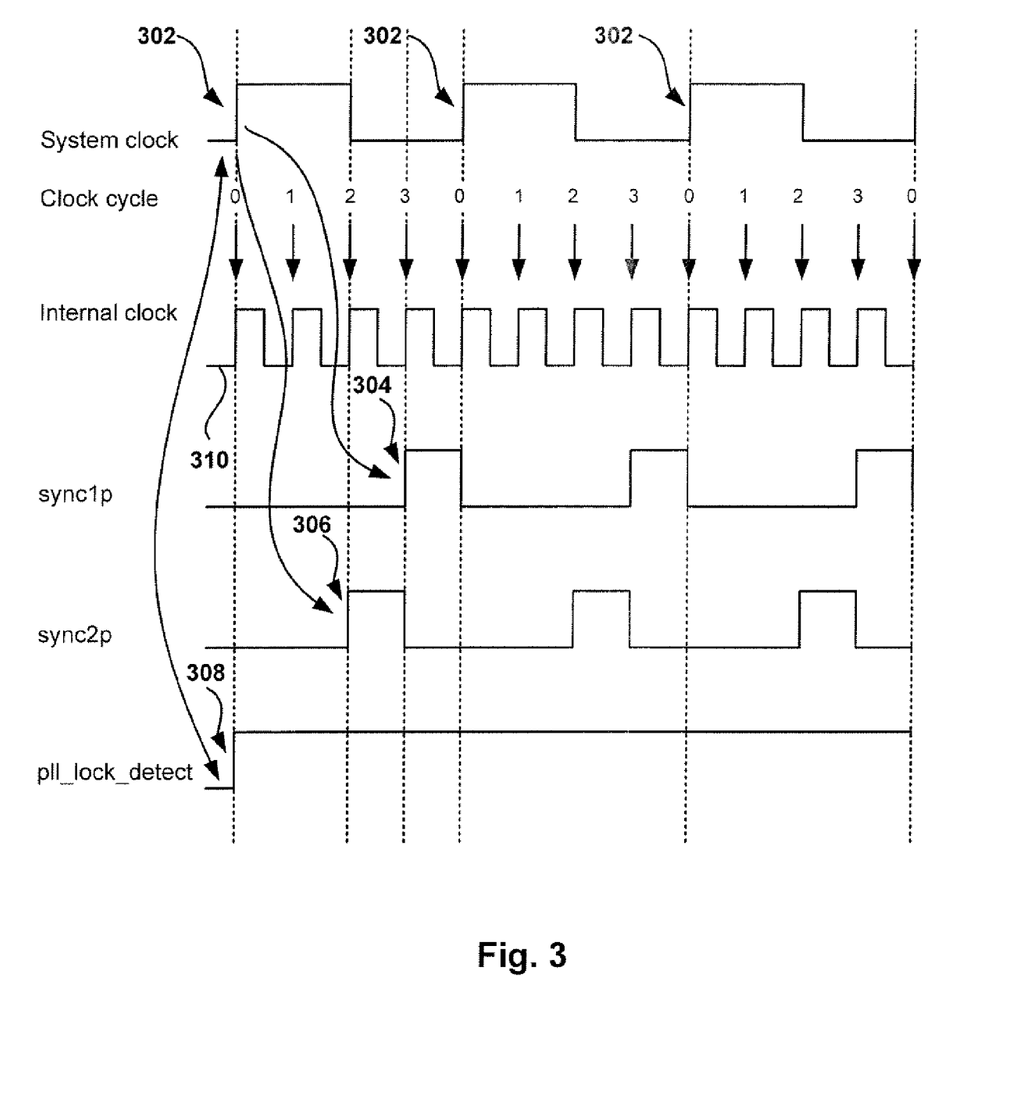
FIG. 3 shows the waveforms for syncnp signals in reference to the different clocks and the pll_lock_detect signal for one embodiment.

FIG. 3 shows the waveforms for syncnp signals 304, 306 in reference to the different clocks and pll_lock_detect 308 signal for one embodiment. The top waveform corresponds to the output of the system clock. System clock rising edge 302 indicates the beginning of a system clock cycle. Internal clock signal 310 is generated in the PLL by multiplying the system clock by a programmed clock divider ratio. In this case, the ratio between internal clock and system clock frequencies is four because there are four internal clock cycles per system clock cycle. Internal clock cycles are numbered with respect to the system clock starting at 0 for the internal clock cycle that begins at the same time as the system clock cycle.

Once pll_lock_detect 308 is logic high, the system will start producing syncnp pulses that anticipate the system clock cycles. Sync1p 304 begins during the internal clock cycle immediately before the beginning of the system clock cycle, or in other words, in cycle 3 according to the numbering used. Sync1p lasts one period of the internal clock, thus ending at the time of system clock rising edge 302. In other embodiments the syncnp pulse can have different durations, such as for example having the same duration as an internal clock pulse. Sync2p 306 takes place in the internal clock cycle preceding sync1p, or 2 cycles before the rising edge of the system clock. Sync1p and sync2p will continue to occur periodically until pll_lock_detect 308 goes low (not shown in FIG. 3). In some embodiments, only one of the syncnp signals is needed by the internal logic of an electronic component, while other components may rely in a plurality of syncnp signals, for example, sync1p, sync2p, sync3p, and sync4p.

Figure 4:
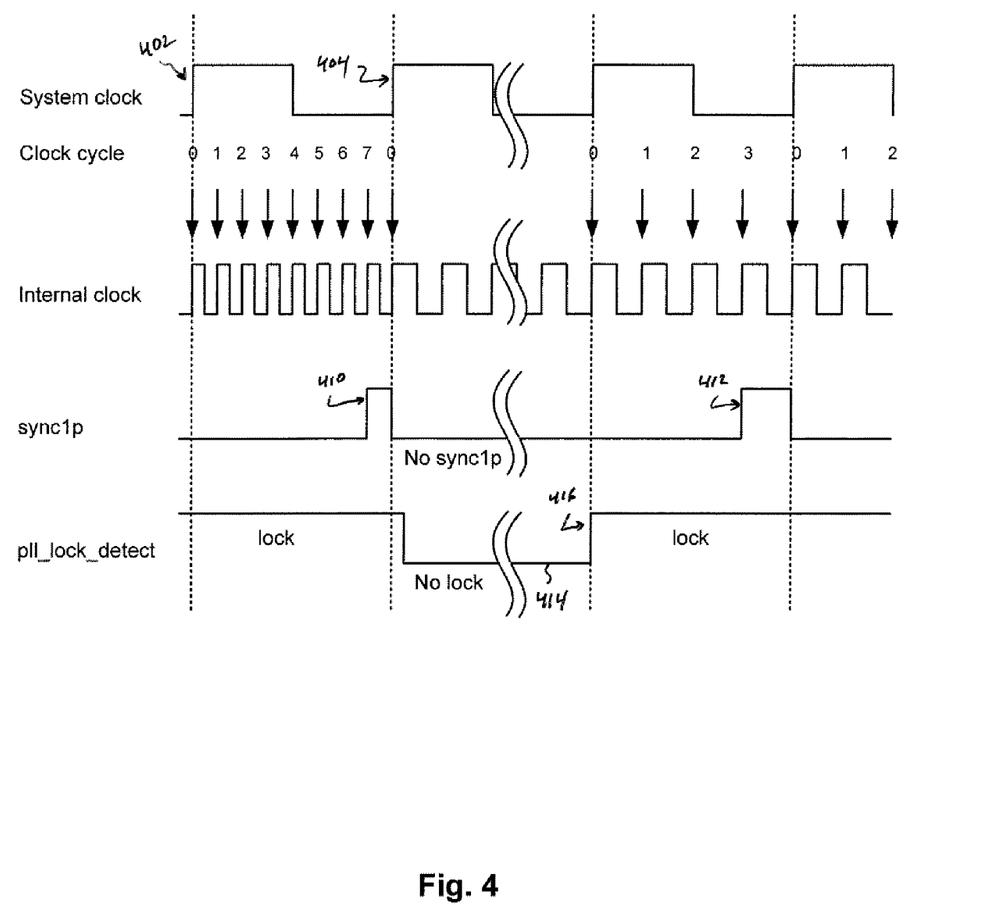
FIG. 4 depicts the waveforms for a sync1p signal as the internal clock changes its frequency ratio with respect to the system clock, according to one embodiment.

FIG. 4 depicts the waveforms for a sync1p signal as the internal clock changes its frequency ratio with respect to the system clock, according to one embodiment. At system clock rising edge 402, the system is generating sync1p signals 410 because the pll_lock_detect signal is logic high. During the first cycle of the system clock, the internal clock is operating at 8 times the frequency of the system clock; therefore there are 8 pulses of the internal clock signal for each pulse of the system clock signal, the cycles being numbered from 0 to 7. Some time after second edge 404 of the system clock, the internal clock frequency is changed to be four times the system clock frequency. Because the clocks are not synchronized at this time, pll_lock_detect signal goes logic low until the internal clock is again synchronized, causing pll_lock__detect edge 416 to go logic high again. It takes some time to synchronize, and once the PLL obtains the lock, the lock detect signal is asserted. The number of system clock cycles required for the synchronization can vary according to the device. A typical value is 100 microseconds, but other values are also possible. The actual latency depends on the delay of the clock distribution network, among other factors.

During PLL not locked period 414, sync1p pulses are not generated because there is no utility in having a synchronization pulse when there is no synchronization. After pll_lock__detect edge 416 goes high, the system starts generating sync1p 412 pulses again, in this case during clock cycle period 3. Since the sync1p pulse lasts for one cycle of the internal clock, the new sync1p pulse is twice as long as the previous sync1p corresponding to a higher internal clock frequency.

Figure 5:
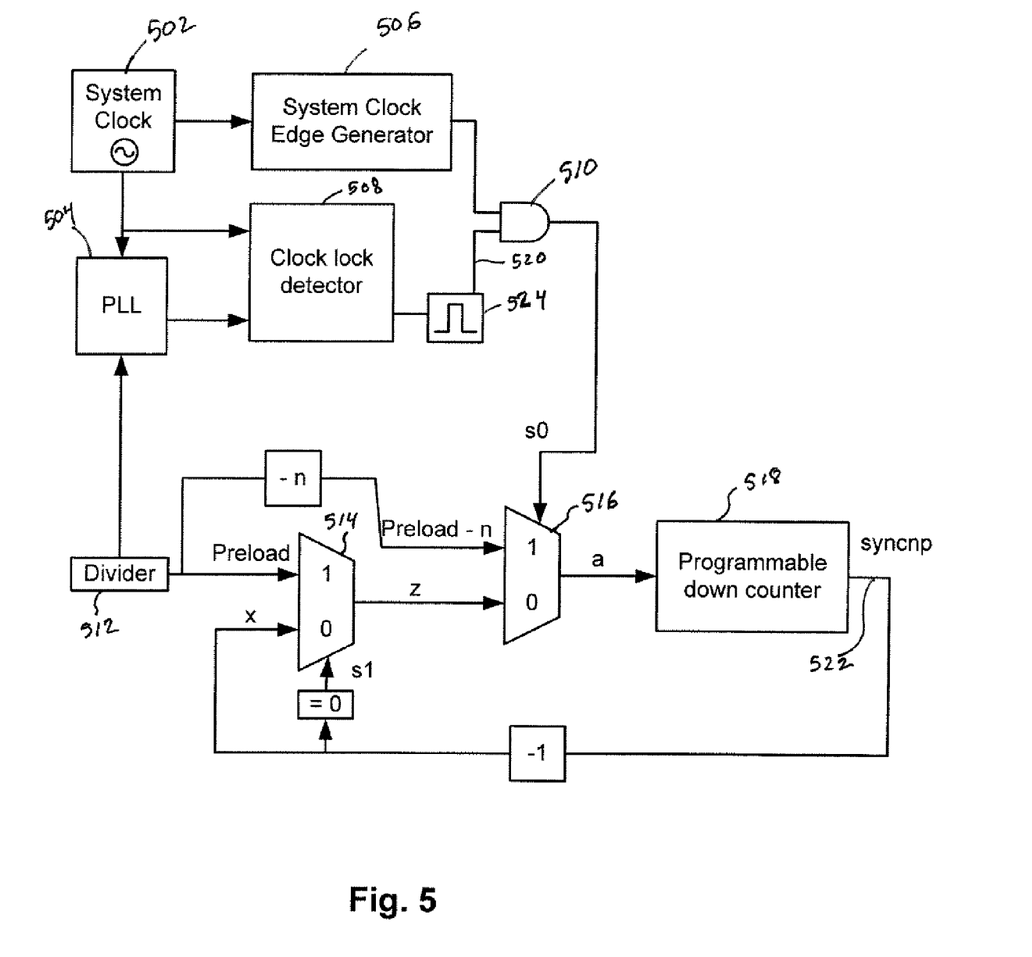
FIG. 5 is a schematic circuit representation for the creation of syncnp pulses using the pll_lock_detect signal according to one embodiment.

FIG. 5 is a schematic circuit representation for the creation of syncnp 522 using pll_lock_detect according to one embodiment. System clock 502 generates the clock signal used in a computer system. The system clock signal is used by PLL 504 to generate an internal clock frequency used inside a computer device. The frequency generated by PLL 504 is determined by the input from divider 512 register that indicates the ratio between the internal and system clocks frequencies. In one embodiment, divider 512 is a programmable logical device. The system clock output is also used by system clock edge generator 506 and by clock lock detector 508. System clock edge generator 506 outputs a logic high signal coinciding with the beginning of a system clock pulse. Clock lock detector 508 compares the system clock 502 and PLL 504 outputs to determine when the internal clock is locked to the system clock, and generates a pll_lock_detect 524 once the internal clock is locked to the system clock. The pll_lock__detect 524 is then converted to pll_lock_detect_high 520 pulse before being inputted to AND gate 510. In some embodiments, clock lock detector 508 can be part of PLL 504 logic, and pll_lock_detect and pll_lock_detect_high are therefore generated directly by the PLL.

Programmable down counter 518 is used to generate the syncnp pulses, as described with more detail with respect to FIG. 6 below. A cycle_load multiplexer 514 has one input associated with the ratio between the frequencies of the internal and system clock, and another input connected to the output from programmable counter 518. The selector s1 for cycle_load multiplexer 514 is a function of the output from programmable down counter 518, whereby only when the programmable down counter reaches zero, will cycle_load multiplexer 514 select the value coming from divider 512.

The output from cycle_load multiplexer 514 is one of the inputs for first_count_load multiplexer 516. The other input for first_count_load multiplexer 516 is also a function of the output from divider 512, but discounted for the number of cycles desired for the syncnp signal to anticipate the system clock. The select signal s0 for first_count_load multiplexer 516 is the logical AND 510 of the system clock edge generator and pll_lock_detect_high 520, and when both are logic high, first_count_load multiplexer 516 will select the value associated with the divider, otherwise, when s0 is logic low, the first_count_load multiplexer will transfer the output of cycle_load multiplexer 514. The output of first_count_load multiplexer 516 is used to load the value used by the programmable down counter.

In one embodiment, preload is equal to the frequency ratio minus 1, and preload-n is equal to preload minus the number of internal cycles where the syncnp will anticipate the rising edge of the system clock. For example, if the frequency ratio is 8, and it is desired to produce sync1p signals, the preload value inputted to cycle_load multiplexer 514 is 7. The preload-n value inputted to first_count_load multiplexer 516 will be 6, because the sync1p pulse must precede the system clock by one cycle. More details on how the preload and preload-n values are used are given below with respect to FIG. 6.

Figure 6:
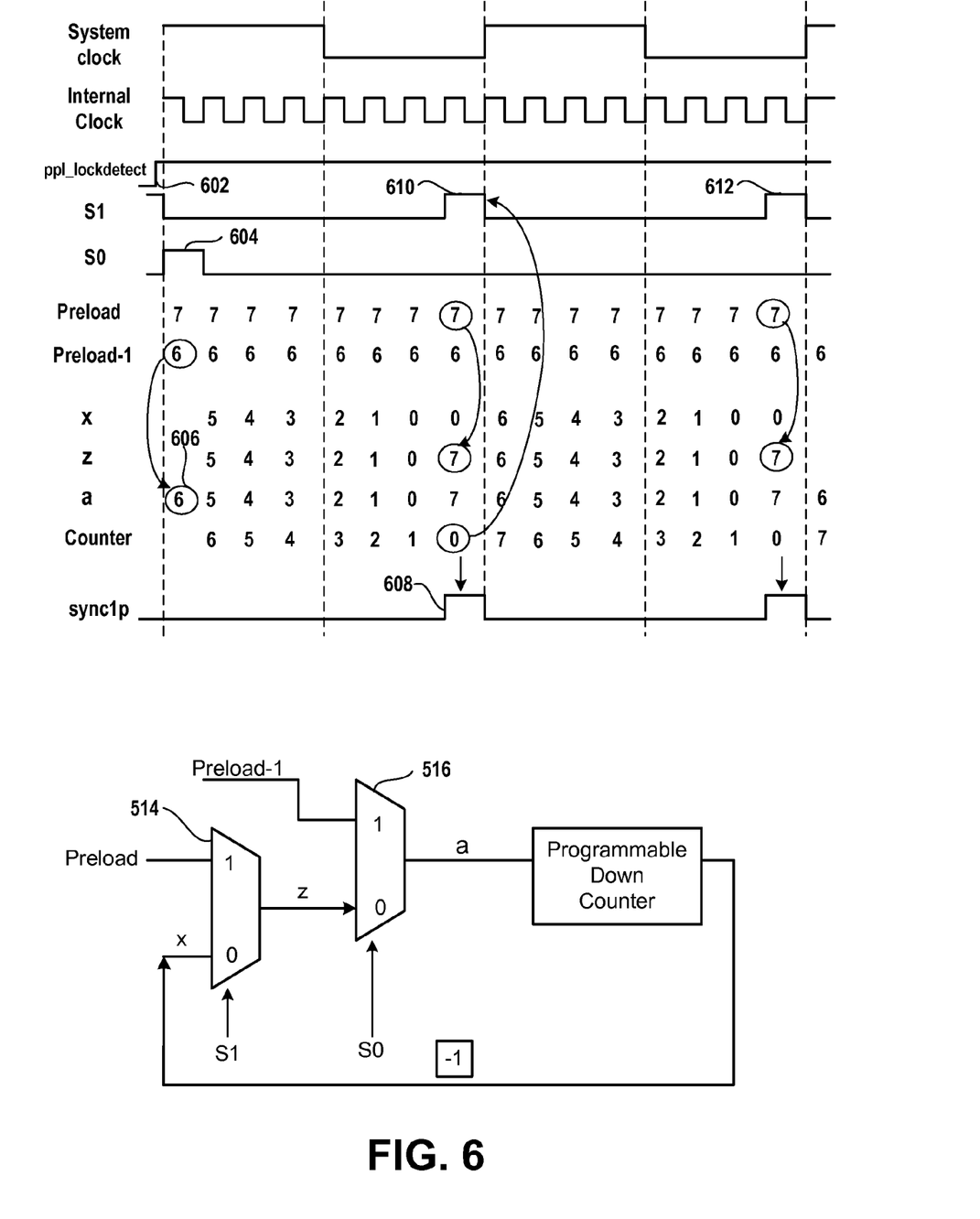
FIG. 6 shows the waveforms and values of different elements in the circuit that generates the syncnp pulses beginning with a first sync1p after pll_lock_detect is generated in one embodiment of the invention.

FIG. 6 shows the waveforms and values of different elements in the circuit that generates the sync1p pulses, beginning with first sync1p 608 after pll_lock_detect 602 goes logic high, in one embodiment of the invention. Notice that some of the values and waveforms described (x, z, a) correspond to the gates identified at the bottom of the page. For example, gate z indicates the value of the input to first_count__load multiplexer 516. At the time the clocks are locked 602, the logic for generating syncnps begins. In this case, the circuit generates sync1p pulses. At the first rising edge of the system clock following pll_lock_detect going logic high, the s0 signal goes logic high because s0 is the logical AND of the system clock edge and the clock lock signals, as seen in FIG. 5. Because the frequency ratio is 8 and sync1p s are being produced, the value of preload is 7, and the value of preload-1 is 6, which is fed to the first_count_load multiplexer. If sync2p pulses were produced, the value fed to the first_count__load multiplexer would be 5, etc. At this point the output a of first_count_load multiplexer 516 is therefore 6, which is used to load the programmable down counter.

During the next cycle of the internal clock, the counter has a value of 6, therefore x has a value of 6-1, or 5. Since s1 is logic low, the output of cycle_load multiplexer 514 is also 5, and since s0 is low, the output of the first_count_load multiplexer is also 5. The counting down continues in the following cycles without changes because s0 and s1 are continue being logic low.

When the countdown reaches 0, the sync1p pulse is generated by the programmable down counter. At the same time, s1 will be positive during pulse 610 because s1 is logic high when the value in the counter is 0. Because s1 is logic high, cycle_load multiplexer 514 selects the value of preload, which is 7, that is again propagated to the counter to start a new cycle. The countdown will proceed as before until the counter reaches zero and a new sync1p pulse is generated, at which time the cycle restarts by loading 7 into the counter.

Figure 7:
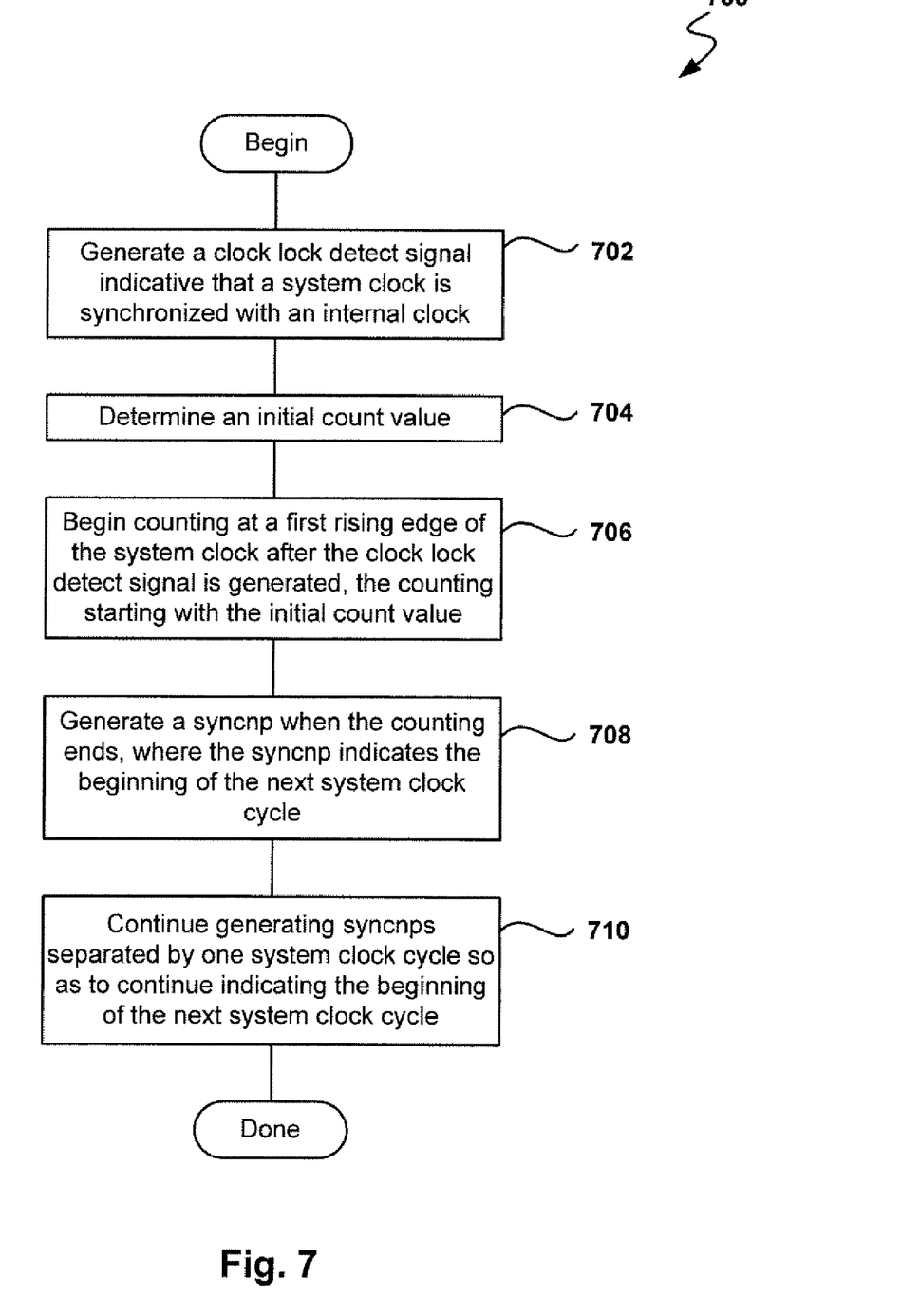
FIG. 7 shows the process flow for generating syncnp pulses according to one embodiment of the invention.

FIG. 7 shows the process flow for generating syncnp pulses according to one embodiment of the invention. In operation 702, a clock lock detect signal is generated to indicate that the system clock is synchronized with the internal clock. In one embodiment, this signal can be generated by a PLL, while in other embodiments the signal is generated by circuitry outside the PLL. Typically, the signal is a level signal to indicate when the synchronization occurs where logic low indicates no lock present. In operation 704, an initial count value is determined as a function of the clocks frequencies ratios and the position of the syncnp pulse. In one embodiment where the programmable down counter creates the syncnp pulses, the value of the initial value will be equal to the ratio between the clocks frequencies minus one, because of the counting down to zero, minus the number of cycles desired for the syncnp to appear before the beginning of the system clock cycle. That is, the initial value for a frequency ratio of 8 to create sync2p pulses will be 8 minus 1 minus 2, resulting in an initial value of 5.

In operation 706, the count starts with the initial value determined in operation 704. The count begins at the first rising edge of the system clock after the internal clock and the system clocks are synchronized. This synchronization is indicated by the clock lock detect signal. When the counting ends 708, the syncnp is generated to indicate that the next system clock cycle will begin.

In operation 710, the system will continue to produce periodic syncnp pulses separated by the duration of the system clock cycle. The syncnp pulses will continue until the clock lock detect signal indicates that the system clock and the internal clock are not synchronized.

It should be noticed that embodiments of the present invention have been described using particular names for different signals, exemplary waveforms and distinct relative timing events. Such signals, waveforms, and timing events are not exclusively tied to embodiments of the present invention, and other names, waveforms, and events are possible as long as the functionality principles described herein are maintained.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for generating system clock synchronization pulses (syncnp), the method comprising:
   generating a clock lock detect signal indicative that a system clock is synchronized with an internal clock;
   determining an initial count value;
   counting beginning at a first rising edge of a system clock signal after the clock lock detect signal is generated, the counting starting with the initial count value; and
   generating a syncnp when the counting ends, the syncnp being indicative of a beginning of a next system clock cycle.

2. The method as recited in claim 1, wherein the internal clock is a phase locked loop (PLL), and wherein the clock lock detect signal is generated by the PLL.

3. The method as recited in claim 1,
   wherein the counting further comprises counting down at every cycle of the internal clock,
   wherein the counting ends when the counting down reaches zero.

4. The method as recited in claim 3, wherein the determining an initial count value further comprises setting the initial count value to the ratio between the frequencies of the internal clock and the system clock minus one minus a number of internal clock cycles desired for the syncnp to anticipate the rising edge of the system clock.

5. The method as recited in claim 1, wherein the syncnp has a duration of one cycle of the internal clock.

6. The method as recited in claim 1 further comprising,
   continue generating syncnps separated by one system clock cycle so as to continue indicating the beginning of the next system clock cycle.

7. The method as recited in claim 6, wherein continue generating syncnps further comprises,
   determining an initial cycle value as the ratio between the frequencies of the internal clock and the system clock minus one,
   beginning counting when the previous syncnp is generated, the counting starting with the initial cycle value,
   counting down at every cycle of the internal clock, and
   generating a new syncnp when the counting down reaches zero.

8. The method as recited in claim 1 further comprising,
   stopping generating syncnps when the clock lock detect signal indicates that the system clock and the internal clock are not synchronized.

9. A method for generating system clock synchronization pulses (sync1p) during the last cycle of an internal clock before a system clock cycle begins, the method comprising:
   generating a clock lock detect signal when a system clock and an internal clock are synchronized;
   counting down beginning at a first rising edge of a system clock signal after the clock lock detect signal is generated, the counting starting with the value corresponding to the ratio between the frequencies of the internal clock and the system clock minus two; and
   generating a sync1p when the counting reaches zero, the sync1p having a duration of one cycle of the internal clock, the sync1p being indicative of a beginning of a next system clock cycle right following the sync1p.

10. The method for generating sync1p as recited in claim 9 further comprising,
    continue generating sync1ps separated by one system clock cycle as long as the clock lock detect signal indicates that the system clock and the internal clock are synchronized.

11. The method for generating sync1p as recited in claim 10, wherein the continue generating sync1ps further comprises,
    beginning counting at the previous sync1p, the counting starting with the ratio between the frequencies of the internal clock and the system clock minus one, and
    generating a new sync1p when the counting reaches zero.

12. The method for generating sync1p as recited in claim 9 further comprising,
    stopping generating sync1ps when the clock lock detect signal indicates that the system clock and the internal clock are not synchronized.

* * * * *